(12) United States Patent
Enriquez

(10) Patent No.: US 6,411,163 B1
(45) Date of Patent: Jun. 25, 2002

(54) TRANSCONDUCTANCE AMPLIFIER CIRCUIT

(75) Inventor: Leonel Ernesto Enriquez, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/639,408

(22) Filed: Aug. 14, 2000

(51) Int. Cl.[7] .............................................. H03F 3/45
(52) U.S. Cl. ...................................... 330/257; 330/260
(58) Field of Search .......................... 330/69, 252, 257, 330/260, 261

(56) References Cited

U.S. PATENT DOCUMENTS

| | | | |
|---|---|---|---|
| 4,091,333 A | 5/1978 | Thrap | 330/100 |
| 4,558,287 A | * 12/1985 | Tanaka | 330/257 |
| 5,210,506 A | * 5/1993 | Koch et al. | 330/255 |
| 5,357,210 A | 10/1994 | Miljanic et al. | 330/15.1 |
| 5,671,272 A | 9/1997 | Cotreau | 379/382 |
| 5,929,623 A | * 7/1999 | Hoshino | 330/257 |
| 6,154,094 A | * 11/2000 | Seven | 330/257 |

FOREIGN PATENT DOCUMENTS

| | | | | |
|---|---|---|---|---|
| JP | 407007337 A | * 1/1995 | | H03F/3/34 |
| JP | 408018398 A | * 1/1996 | | H03F/1/34 |

* cited by examiner

*Primary Examiner*—Robert Pascal
*Assistant Examiner*—Khanh V. Nguyen
(74) *Attorney, Agent, or Firm*—Allen, Dyer, Doppelt, Milbrath & Gilchrist, P.A.

(57) ABSTRACT

A transconductance amplifier circuit, which may used in a subscriber line interface circuit, transforms a single ended input voltage into a precise, single ended output current, in a manner that is effectively independent of respective voltage supply rails, and which can be operated at a very low quiescent current. An operational amplifier is configured as a unity gain buffer whose output stage is coupled in circuit with first current flow paths of first and second current mirrors. A single ended output of the output stage serves as an input terminal and is coupled via a negative feedback path to a first, inverting input of the operational amplifier. Second current flow paths of the pair of current mirrors are coupled to an output port, which supplies an output current linearly proportional to the composite input voltage applied to the input terminal. An auxiliary current mirror circuit pair may be cross-coupled to the first and second current mirrors to supply to a second output port a current that is equal and opposite to the output current. These two equal and opposite polarity currents may be coupled to respective tip and ring output amplifiers for application to a telephone wireline pair.

14 Claims, 4 Drawing Sheets

TRANSCONDUCTANCE AMPLIFIER CIRCUIT

FIELD OF THE INVENTION

The present invention relates in general to communication systems and components, and is particularly directed to a transconductance amplifier circuit, that is configured to transform a single ended input voltage into a very precise, single ended output current, in a manner that is effectively independent of respective voltage supply rails through which the amplifier circuit is powered, and which can be operated at a very low quiescent current. As a non-limiting example, the invention may be readily employed to implement various circuit blocks of a subscriber line interface circuit, enabling it to enjoy substantially reduced power requirements for interfacing communication signals with a telecommunication wireline pair.

BACKGROUND OF THE INVENTION

A wide variety of electronic circuit applications employ one or more transconductance stages to generate output/drive currents that can be reasonably accurately controlled for delivery to one or more loads. As a non-limiting example, various equipments employed by telecommunication service providers contain what are known as 'SLIC's (subscriber line interface circuits), to interface (transmit and receive) telecommunication signals with respect to (tip and ring leads of) a (copper) wireline pair.

Because the length of the wireline pair can be expected to vary from installation to installation, may have a very significant length (e.g., on the order of multiple miles), and transports both substantial DC voltages, as well as AC signals (e.g., voice and/or ringing), designing a SLIC that has 'universal' use in both legacy and state of the art installations continues to be a daunting task for the circuit designer.

In order to accommodate the above-referenced parameter variations in a telecommunication signalling environment, it is customary practice to configure the SLIC as a transconductance amplifier-based circuit, that produces a prescribed output current in response to an input voltage.

One of the issues involved in using a transconductance amplifier circuit is the fact that it must not only deliver a very precisely controlled output current, but must do so irrespective of the voltages of the supply rails from which it is powered.

Conventional transconductance amplifier stages, whether they involve single ended implementations or differentially coupled transistor pairs (such as that shown at Q1–Q2 in FIG. 1), usually suffer from the presence of one or more non-linearities associated with unequal or mismatched diode junctions in the components of the circuit generating a single ended output current.

One way to obviate this problem would be to employ a differentially balanced operational amplifier circuit architecture, such as that illustrated diagrammatically in FIG. 2. As shown therein, a pair of operational amplifiers A1 and A2 may be coupled to respective drive inputs (bases) of a pair of transistors Q1–Q2. Transistors Q1 and Q2 have their output (collector-emitter) current flow paths coupled in a differential configuration between a current mirror circuit M and negative feedback paths of the amplifiers A1 and A2, which terminate opposite ends of an impedance (resistance) Z. Although this dual amplifier circuit design enables an output current to be precisely generated in terms of an applied input voltage, it does so at an increase in complexity and therefore device count, power and cost, and is constrained by the large signal bandwidth limitations of the operational amplifiers.

SUMMARY OF THE INVENTION

In accordance with the present invention, shortcomings of conventional transconductance amplifier circuits, such as those discussed above, are effectively obviated by a new and improved transconductance amplifier circuit, that is operative to transform a single ended input voltage (which may be a composite of plural input voltages) into a very precise, single ended output current, without requiring a substantial quiescent current, and in a manner which is effectively independent of (differential) voltage supply rails through which the circuit is powered.

For this purpose, the transconductance amplifier circuit of the invention includes an operational amplifier configured as a single ended, unity gain buffer, having a high input impedance, moderate voltage gain, dual polarity input stage, and a low output impedance, single ended output stage. The input stage has its non-inverting polarity input referenced to a DC reference voltage (which may be signal ground), and its inverting polarity input coupled over a negative feedback path to an input/output node of the output stage. The output stage is configured as a DC biased, differentially coupled transistor buffer circuit pair.

Unlike a conventional amplifier circuit, the input/output node of the output stage, rather than being employed to supply an output current to a downstream load, is employed as an input node and is adapted to receive one or more input currents coupled via one or more coupling resistors from associated input voltage feed ports. Also, series-connected current paths through output transistors of the differentially coupled output stage buffer circuit transistor pair, rather than being powered directly by respective voltage supply rails (e.g., Vcc and Vee), are coupled in circuit with first current supply paths of associated current mirror circuits, which serve to isolate the biasing of the amplifier's output stage from the power supply rails. Second current supply paths of the current mirror circuits are coupled to the single ended output port of the transconductance amplifier circuit.

The relationships among the currents through the two current supply paths of the mirror circuits and the input/output node of the output stage of the transconductance amplifier of the present invention are such that the output current produced at the single ended output port is linearly proportional to the (composite) input current appearing at the input/output node of the output stage. In addition, if the time average value of each of the input voltages applied to the voltage input terminals is equal to the reference voltage applied to the non-inverting input of the operational amplifier and that reference voltage is a DC voltage, then the time averages of the mirrored currents supplied to the output stage are proportional to the DC bias current flowing in the output stage. As a consequence, if the value of the DC bias current is small and the current mirror ratio K is equal to or less than one, the quiescent power can be reduced to an extremely low value.

One application of the transconductance amplifier circuit of the present invention is as a building block for one or more subcircuits employed within a subscriber line interface circuit, used to interface communication signals supplied from a device, such as a modem, with a tip and ring ports of a wireline pair for transport to a remote circuit, such as a subscriber's telephone. In the case of a receiver channel circuit, as a non-limiting example, the transconductance amplifier of the invention may be augmented by a pair of auxiliary current mirror circuits cross-coupled with the above-referenced current mirror circuits of the transconductance circuit. The current relationships associated with the cross-coupling of the auxiliary current mirror circuits with those of the transconductance amplifier circuit are such that the auxiliary current mirror circuits supply the same precision output current (but in an opposite directional sense) at an additional output port. These two (opposite polarity) current output ports are applied through respective output amplifiers to tip and ring output ports for application to a telephone wireline pair.

The input/output node of the transconductance amplifier is coupled through respective input resistors to receive a plurality of input channel voltages. These input channels may include a received channel signal, a feedback channel voltage (which may be obtained by sensing a tip-ring output voltage for synthesizing an appropriate value of a termination impedance between the tip and ring terminals), a teletax or pulse metering signal, and a ringing signal voltage. The voltage gain for each input signal can be appropriately tailored by the selected value of its input resistor.

The DC output voltages at the tip and ring ports are determined by DC bias currents supplied by tip and ring DC bias current sources multiplied by the values of feedback resistors between the tip and ring ports and inputs of the tip and ring output amplifiers. These DC bias currents provide an overhead voltage for the sum of all of the input voltages applied to the input/output port of the transconductance amplifier, as well as a sufficient differential DC voltage between the tip and ring terminals to supply the necessary DC current required to bias the phone at the far end of the loop, which may be more than several miles away.

DETAILED DESCRIPTION

Figure 1:
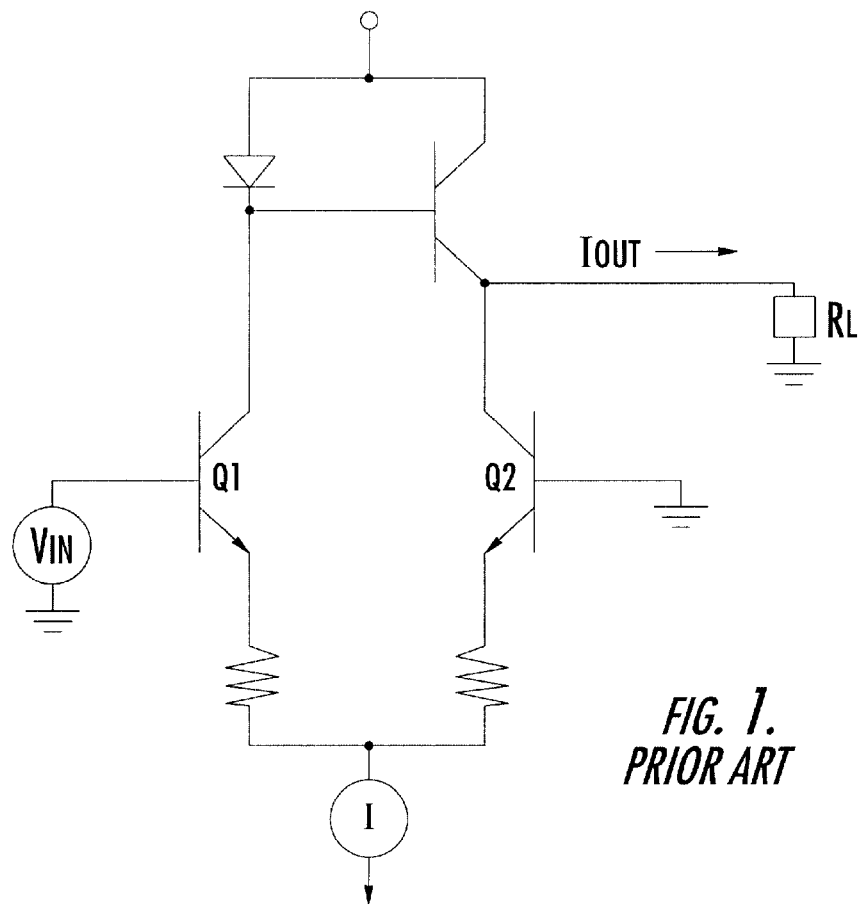
FIG. 1 shows a simplified conventional single stage transconductance circuit.
Figure 2:
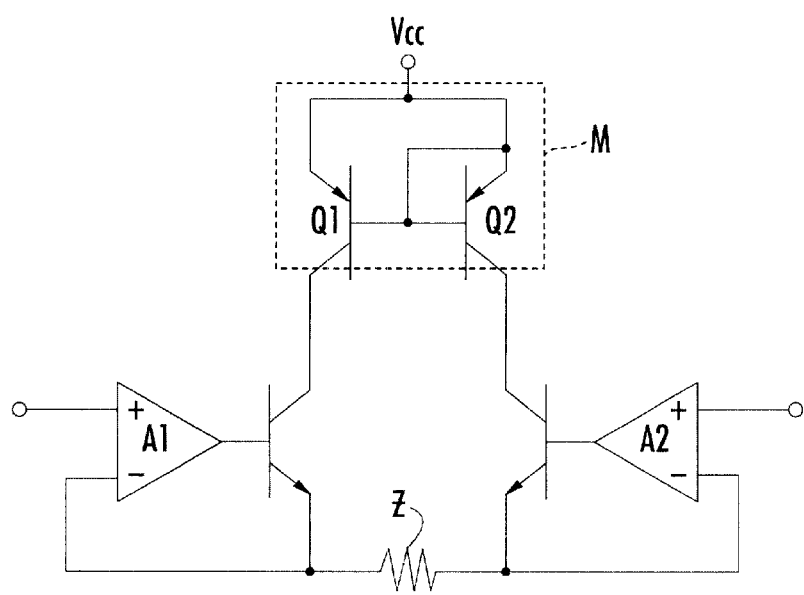
FIG. 2 diagrammatically illustrates a transconductance amplifier circuit having a differentially balanced operational amplifier pair.
Figure 3:
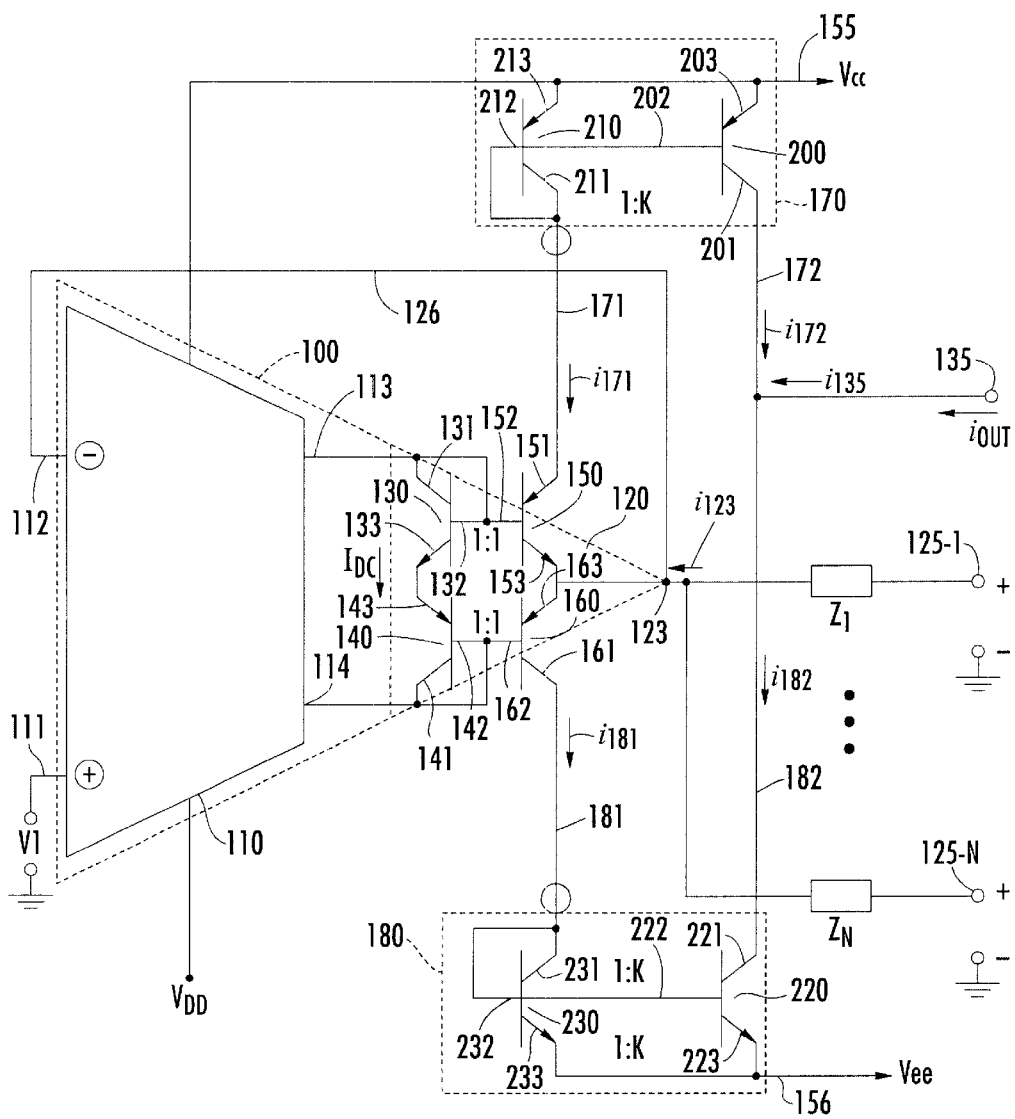
FIG. 3 diagrammatically illustrates a transconductance amplifier circuit in accordance with the present invention.

A non-limiting, bipolar transistor-configured embodiment of the transconductance amplifier circuit of the present invention is diagrammatically illustrated in FIG. 3. Although bipolar devices are shown, it is to be understood that the invention is not limited thereto, but also may be implemented using alternative equivalent components, such as field effect transistors (FETs), for example. The transconductance amplifier circuit is shown in broken lines 100, and includes an operational amplifier configured as a unity gain buffer. The operational amplifier has a dual polarity input operational amplifier input and gain stage 110, and a low output impedance, single ended output stage 120. The input stage 110, which may have a conventional high impedance, moderate voltage gain circuit configuration, has a first, non-inverting polarity input 111, that is adapted to be coupled to a DC reference voltage, shown as a voltage v1 (relative to ground (GND)), and a second, inverting polarity input 112, which is adapted to track the voltage v1. The input voltage v1 can be selected in compliance with the overhead voltages and power dissipation required by the specific application in which the transconductance amplifier circuit is employed.

The output stage 120 includes a differentially coupled transistor circuit pair, having a first, diode-connected NPN transistor 130, whose collector 131 and base 132 are connected in common to a first polarity output port 113 of the amplifier's input stage 110. The emitter 133 of transistor 130 is coupled in common to the emitter 143 of a second, diode-connected PNP transistor 140. In a complementary fashion, PNP transistor 140 has its collector 141 and base 142 connected in common to a second polarity output port 114 of the amplifier input stage 110. The base 132 of NPN transistor 130 is coupled in common with the base 152 of an NPN transistor 150, the emitter 153 of which is coupled in common to the emitter 163 of a PNP transistor 160 and to an input/output node 123 of output stage 120.

The PNP transistor 160 has its base 162 coupled in common with the base 142 of the PNP transistor 140. The output stage's input/output node 123 is coupled over a negative feedback path 126 to the inverting input 112 of the input stage 110. As noted above, unlike a conventional amplifier circuit, the input/output node 123, rather than being employed to supply an output current to a downstream load, is coupled to receive one or more input currents, respectively supplied through one or more coupling resistors Z1, ... ZN, to associated voltage feed ports 125-1, ... , 125-N.

The series-connected, collector-emitter current paths through the output transistors 150 and 160 of the transconductance amplifier's output stage 120, rather than being biased via a direct coupling to respective (Vcc and Vee) voltage supply rails 155 and 165, are coupled in circuit with first current supply paths 171 and 181 of first and second current mirror circuits 170 and 180, respectively. As pointed out briefly above, these current mirror circuits serve to isolate the biasing of the amplifier's output stage 120 from its power supply terminals, so that the output current produced at a single ended output port 135 can be accurately controlled independent of the values of the power supply voltages.

The current mirror circuit 170 includes a first PNP transistor 200 having its emitter 203 coupled to the (Vcc) voltage supply rail 155, and its base 202 coupled in common with the base 212 and collector 211 of a diode-connected current mirror PNP transistor 210, whose emitter 213 is coupled to (Vcc) voltage supply rail 155. The current mirror transistor 200 supplies a mirrored output current to the current supply path 172 as a prescribed factor K of the current received by transistor 210 over the current supply path 171, in accordance with the ratio (1:K) of the geometries of the transistors 210/200. The collector 211 and base 212 of transistor 210 are coupled over the first current supply path 171 of the current mirror 170 to the collector 151 of transistor 150 of the output stage 120. The collector 201 of transistor 200 is coupled over a second current supply path 172 of the current mirror 170 to a transconductance stage output node 135.

The current mirror circuit 180 includes a first NPN transistor 220 having its emitter 223 coupled to the (Vee) voltage supply rail 156 and its base 222 coupled in common with the base 232 and collector 231 of a diode-connected current mirror NPN transistor 230, whose emitter 233 is coupled to (Vee) voltage supply rail 156. The collector 231 and base 232 of the current mirror transistor 230 are coupled over the first current supply path 181 of the current mirror 180 to the collector 161 of output stage transistor 160. The collector 221 of transistor 220 is coupled over a second current supply path 182 of the current mirror 180 to the output node 135. The current mirror transistor 220 provides a mirrored output current to current supply path 182 as a factor K of the current received by transistor 230 over current supply path 181, in accordance with the (1:K) ratio of the geometries of transistors 230/220.

An examination of current node equations, set forth below, that define the transfer function of the transconductance amplifier circuit of FIG. 3, reveals that it has a very wide dynamic range that accommodates multiple, differential polarity voltages applied at its voltage feed ports 125-1, ..., 125-N. This wide dynamic range is obtained at a very low quiescent power dissipation.

More particularly, the single ended output current $i_{123}$ delivered to input/output node 123 may be defined in equation (1) as:

$$i_{123} = (v_{125-1} - v_{111})/Z_1 + \ldots (v_{125-N} - v_{111})/Z_N = \sum_{i=1}^{N} (v_{125-i} - v_{111})/Z_i \quad (1)$$

The currents $i_{171}$ and $i_{181}$ supplied to current mirrors 170 and 180 may be related to the current $i_{123}$ at the input/output node 123 by equation (2) as:

$$i_{123} + i_{171} = i_{181} ==> i_{123} = i_{181} - i_{171} \quad (2)$$

The currents $il_{72}$ and $i_{182}$ supplied by current mirrors 170 and 180 may be related to the current $i_{135}$ at the output node 135 by equation (3):

$$i_{172} + i_{135} = i_{182} \quad (3)$$

and equation (4) as:

$$Ki_7 + i_{135} = Ki_{181} => i_{out} = i_{135} = K(i_{181} - i_{171}) = Ki_{123} \quad (4)$$

Substituting equation (1) into equation (4) yields equation (5) as:

$$i_{out} = K \sum_{i=1}^{N} (v_{125-i} - v_{111})/Z_i \quad (5)$$

Implicit in equations (2) and (4) are that transistor limitations due to beta and early voltage are compensated or minimized (in a manner not specifically shown in the diagrammatic illustration of FIG. 3). It may also be noted that if transistors 130/150 and 140/160 are matched pairs and the time average value of each of the input voltages applied to the voltage input terminals 125-1, ..., 125-N is equal to v1, and v1 is a DC voltage, then the time average values of currents $i_{171}$ and $i_{181}$ are equal to the DC bias current $I_{DC}$ flowing in the emitter path of the output stage transistors 130–140. Therefore, if the value of the bias current $I_{DC}$ is relatively low and the current mirror ratio K is equal to or less than 1, the quiescent power consumed by the transconductance amplifier circuit of FIG. 3 can be reduced to a very small value.

As described above, a particularly useful application of the transconductance amplifier circuit of FIG. 3 is a building block for one or more subcircuits employed within a subscriber line interface circuit, or SLIC. As a non-limiting example, FIG. 4 diagrammatically illustrates the use of the transconductance amplifier circuit of FIG. 3 in a precision, low power receiver channel circuit that may be incorporated into a SLIC, for interfacing communication signals supplied from a device such as a modem, with a wireline pair for delivery to a remote circuit, such as a subscriber's telephone.

Figure 4:
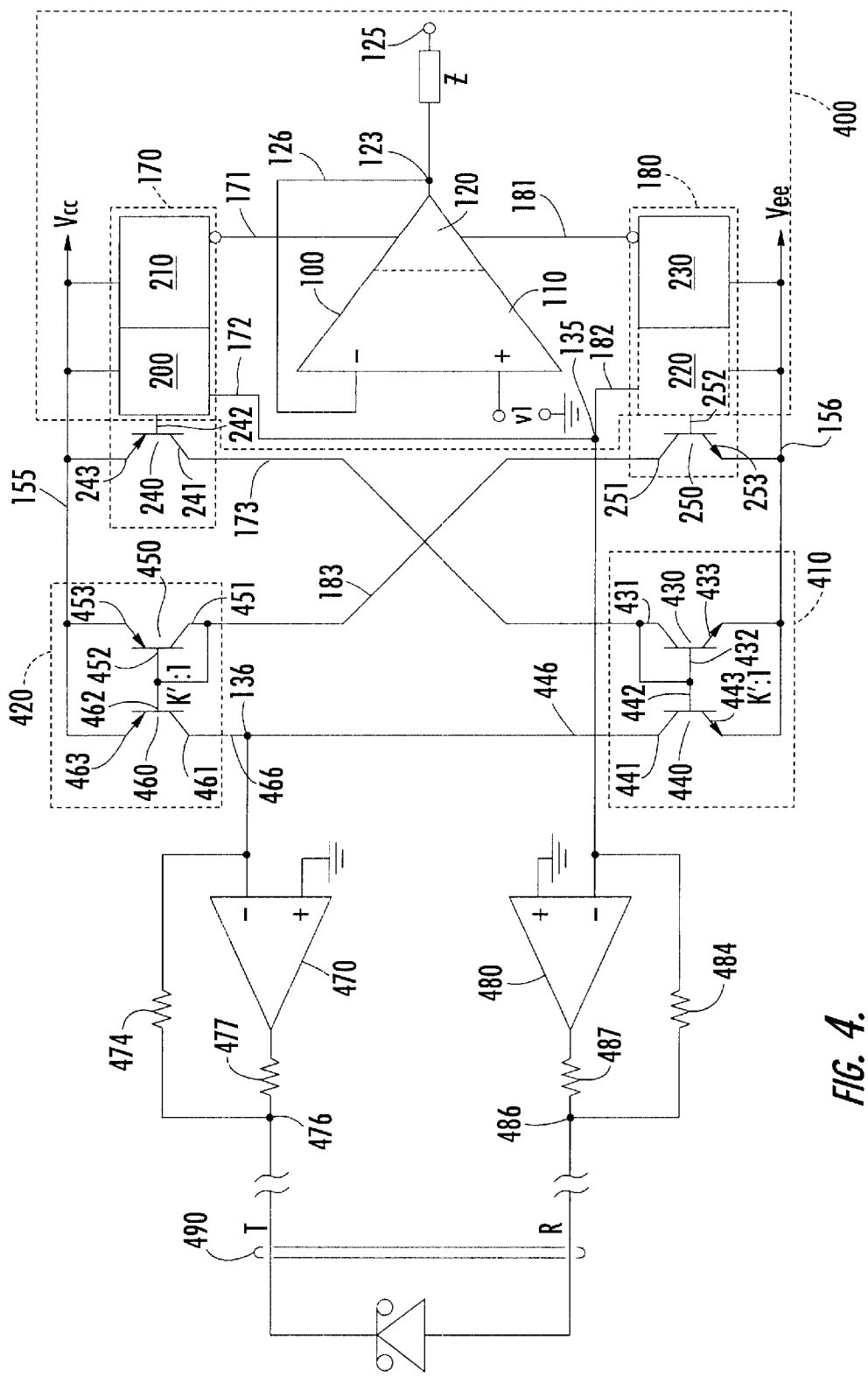
FIG. 4 diagrammatically illustrates the use of the transconductance amplifier circuit of FIG. 3 in a receiver channel circuit of a subscriber line interface circuit.

To this end, the receiver channel circuit of FIG. 4 has a front end transconductance circuit 400, which incorporates the transconductance amplifier circuit of FIG. 3 as its fundamental building block, and includes a pair of auxiliary current mirror circuits 410 and 420, that are cross-coupled with the current mirror circuits 170 and 180 of the transconductance circuit 400. The current node relationships associated with this cross-coupling of the auxiliary current mirror circuits 410 and 420 with current mirror circuits 170 and 180 are such that the auxiliary current mirror circuits 410 and 420 supply to an additional output port 136 the same precision output current (but in an opposite directional sense) that is provided at output port 135 of transconductance amplifier 400. These two (opposite polarity) current output ports 135 and 136 are applied through respective 'tip' and 'ring' output amplifiers 470 and 480, coupled in a voltage follower configuration to respective tip and ring output ports 476 and 486, for application to a (telephone) wireline pair 490 (which may be more than several miles in length) being driven by the receiver channel circuit of FIG. 4.

For this purpose, the current mirror circuit 170 is augmented to include an additional PNP transistor 240 having its emitter 243 coupled to the Vcc voltage supply rail 155, and its base 242 coupled in common with the base of PNP transistor 200. Transistor 240 has its collector 241 coupled over a third, cross-coupling current supply path 173 of the current mirror circuit 170 to the collector 431 and base 432 of an NPN current mirror transistor 430 within the auxiliary current mirror circuit 410. The NPN current mirror transistor 430 has its emitter 433 coupled to the Vee voltage supply rail 156, and its base 432 and collector 431 coupled in common with the base 442 of an NPN transistor 440, whose emitter 443 is coupled to the Vee voltage supply rail 156. Transistor 440 supplies an output current to an output current supply path 446 to output port 136, as a prescribed K' multiple of the current supplied over the third current supply path 173 in accordance with the ratio (K':1) of the geometries of transistors 440/430.

In a complementary fashion, the current mirror circuit 180 is augmented to include an additional NPN transistor 250 having its emitter 253 coupled to the Vee voltage supply rail 156, and its base 252 coupled in common with the base of NPN transistor 220. Transistor 250 has its collector 251 coupled over a third, cross-coupling current supply path 183 of the current mirror circuit 180 to the collector 451 and base 452 of a PNP current mirror transistor 450 within the auxiliary current mirror circuit 420. The PNP current mirror transistor 450 has its emitter 453 coupled to the Vcc voltage supply rail 155, and its base 452 and collector 451 coupled in common with the base 462 of a PNP transistor 460, whose emitter 463 is coupled is to Vcc voltage supply rail 155. Transistor 460 supplies an output current over an output current supply path 466 to output port 136, as a prescribed K' multiple of the current supplied over the third current supply path 183 in accordance with the ratio (K':1) of the geometries of the transistors 460/450.

As in the case of the transconductance amplifier of FIG. 3, an examination of the equations that define the transfer function associated with auxiliary current mirrors 410 and 420 reveals that the additional single ended output node 136 produces an output current that is equal and in opposite direction to the current produced at output node 135. In particular, due to the current mirror action of transistors 430 and 440 of current mirror circuit 410, the current $i_{446}$ supplied by the collector 441 of transistor 440 in the auxiliary current mirror circuit 410 is equal to some factor K' times the third current $i_{173}$ supplied by the collector 241 of the transistor 240 in current mirror circuit 170. Likewise, the current $i_{466}$ supplied by the collector 461 of transistor 460 in the auxiliary current mirror circuit 420 is some factor K' times the value of the fourth output current $i_{183}$ supplied by at the collector 251 of transistor 250 in current mirror circuit 180.

The current flowing into node 136 from the collector 461 of transistor 460 in current mirror circuit 420 may be expressed in equation (6) as:

$$i_{466}=i_{136}+i_{446}==>i_{136}=i_{466}-i_{446} \quad (6)$$

Substituting currents $i_{173}$ and $i_{183}$ into equation (6) yields equation (7) as:

$$i_{136}=K'(i_{183}-i_{173}) \quad (7).$$

For purposes of simplification, letting K and K'=1, then, $i_{171}=i_{173}$ and $i_{181}=i_{183}$, so that $$i_{136}=i_{181}-i_{171}=-i_{135} \quad (8).$$

Namely, the current $i_{out\text{-}136}$ flowing out of current output node 136 into the tip output amplifier 470 can be defined to be equal and in the opposite direction to the current $i_{out\text{-}135}$ flowing from current output node 135 into the ring output amplifier 480.

Figure 5:
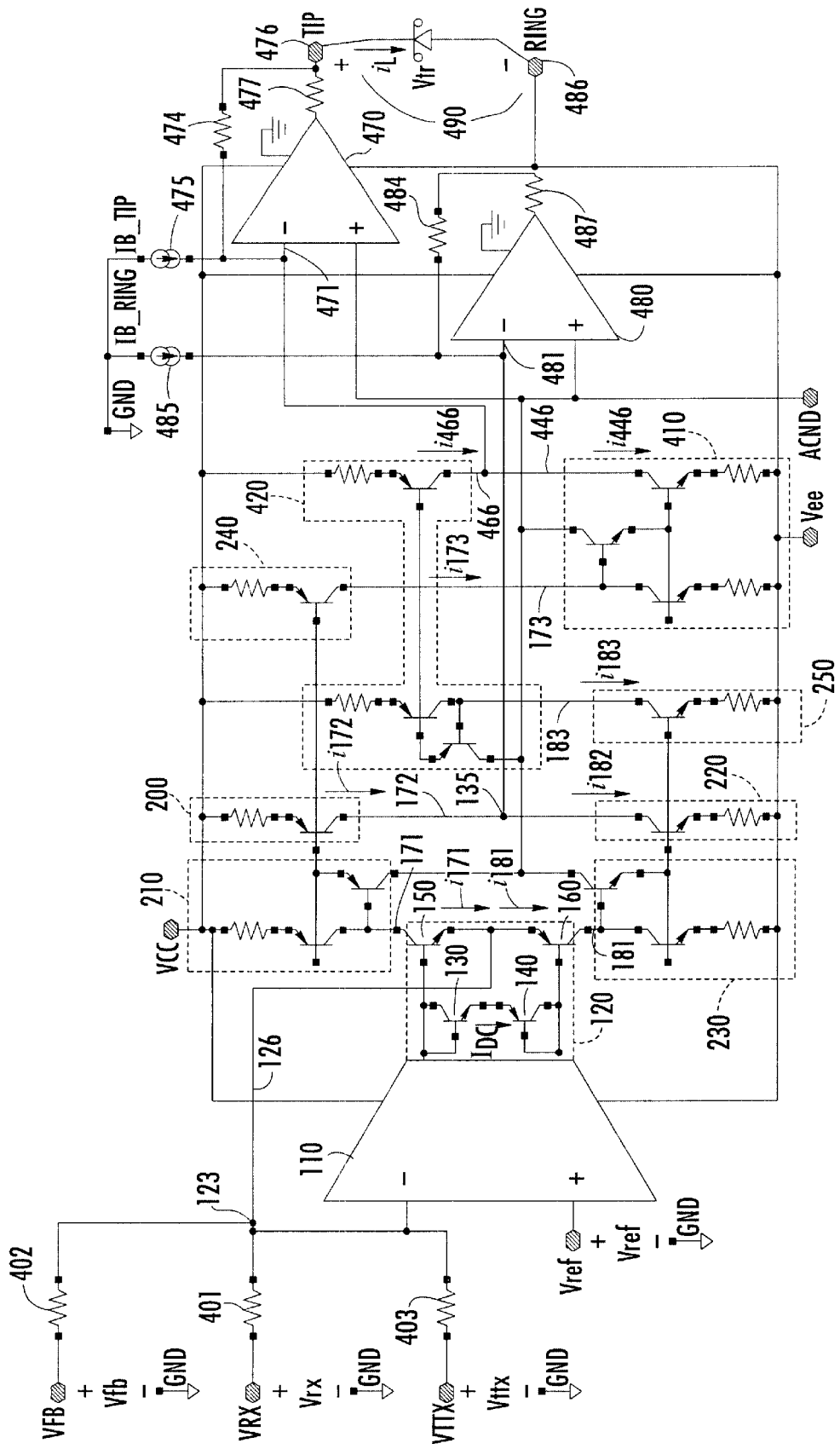
FIG. 5 schematically illustrates a practical implementation of the subscriber line interface circuit of FIG. 4.

As described above, the input/output node 123 of the transconductance amplifier of FIGS. 3 and 4 is coupled to receive one or more input currents, respectively supplied through one or more coupling resistors z1, . . . zN, to associated voltage feed ports 125-1, . . . , 125-n. FIG. 5 schematically illustrates a practical implementation of the SLIC receiver of FIG. 4, wherein the input/output node 123 is coupled (through respective input resistors) to receive a plurality of input channel voltages applied through associated coupling resistors 401–403.

A first of these input channels is a received channel signal VRx which is coupled to node 123 through an associated input resistor 401. A second input channel is a feedback channel voltage Vfb, which is coupled to node 123 through an associated input resistor 402. The actual feedback voltage Vfb is obtained by sensing a tip-ring output voltage Vtr for the purpose of synthesizing an appropriate value of a termination impedance between the tip and ring terminals 476 and 486.

For this purpose, a relatively small valued 'sense' resistor 477, 487, which is several orders in magnitude smaller than the value of input and feedback resistors for the circuit, is installed between the output of the tip and ring output amplifiers 470 and 480 and their associated tip and ring output ports 476 and 486. The feedback voltage Vfb may also be based upon sampling a third input channel voltage Vttx for attenuation purposes. The third input channel is a teletax or pulse metering signal Vttx, which is coupled to node 123 through an associated input resistor 403. For a through-ringing SLIC configuration, a ringing signal (not shown) could also be coupled through an associated input resistance as an additional input channel to input/output node 123.

The tip output amplifier 470 has its output or tip port 476 connected through a feedback resistor 474 to its inverting input port 471. The DC output voltage $VDC_{476}$ at the tip port 476 is determined by a current Ibias_tip supplied by a DC bias current source 475, multiplied by the value of the feedback resistor 474. Namely, $$VDC_{476}=-\text{Ibias\_tip}*R_{474} \quad (9)$$

In a like manner, the ring side output amplifier 480 has its output port 486 connected through a feedback resistor 484 to its inverting input port 481. The DC output voltage $VDC_{476}$ at the ring port 486 is determined by a current Ibias_ring supplied by a DC bias current source 485, multiplied by the value of the feedback resistor 484. Namely, $$VDC_{486}=-\text{Ibias\_ring}*R_{484} \quad (10)$$

The value of the currents Ibias_tip supplied by the tip side bias current source 475 and Ibias-ring supplied by teh ring side bias current source 485 are sufficient to not only provide an overhead voltage (relative to ground and to battery, respectively) for the sum of all of the input voltages applied to the input/output port 123, but to provide sufficient differential DC voltage between the tip and ring terminals to supply the necessary DC current required to bias the phone at the far end of the loop which, as noted above, may be more than several miles away.

For the various signal currents applied through the input resistors 401, 402 and 403 to the input/output node 123, the tip voltage $V_{TIP}$ may be defined in equation (11) as:

$$V_{TIP}=\{(R_{474}/R_{401})Vrx+(R_{474}/R_{402})Vfb+\{(R_{474}/R_{403})Vttx\} \quad (11)$$

From equation (11), it can be seen that the voltage gain for each input signal can be appropriately tailored by the selected value of input resistor.

For the signal currents applied through the input resistors 401, 402 and 403 to the input/output node 123, the ring voltage $V_{RING}$ may be defined in equation (12) as:

$$V_{RING}=\{(R_{484}/R_{401})VRx+(R_{484}/R_{402})Vfb+\{(R_{484}/R_{403})Vttx\} \quad (12)$$

The differential tip-to-ring output voltage Vtr across output terminals 476–486 is defined as $Vtr=V_{TIP}-V_{RING}$.

Since, as detailed above, the current polarity at the tip side output port 136 is opposite to that for the ring side output port 135, then $$Vtr=\{V_{TIP}-V_{RING}\},$$

expressed in equation (13) as:

$$Vtr=-\{(R_{474}+R_{484})/R_{401})Vrx+\{ ((R_{474}+R_{484})/R_{402})Vtfb+((i\ R_{474}+R_{484})/i\ R_{403})Vttx\} \quad (13)$$

It may also be noted that when all input channel signals (Vrx, Vfb and Vttx, in the present example) are quiescent or zero, the current through the output transistors 150 and 160 of the transconductance amplifier's output stage 120 is equal to the DC bias current $I^{DC}$ through its transistors 130 and 140. Where all of the output stage transistors have identical geometries, then for an idle channel condition, the power dissipation can be reduced to an extremely small value for proper choice of the DC bias current $I^{DC}$.

As will be appreciated from the foregoing description, shortcomings of conventional transconductance amplifier circuits are effectively obviated by the improved transconductance amplifier circuit architecture of the invention, that transforms a single ended input voltage into a very precise, single ended output current, without the need to supply a substantial bias current for its various stages, and in a manner which is effectively independent of voltage supply rails through which the circuit is powered. The transconductance amplifier circuit of the invention may be readily incorporated into a receiver channel circuit of a subscriber line interface circuit, by cross-coupling a pair of auxiliary current mirror circuits with the current mirror circuits of the basic transconductance circuit, so as to supply the same precision output current (but in an opposite directional sense) at an additional output port. These two (opposite polarity) current output ports may be applied through respective output amplifiers to tip and ring output ports for application to a telephone wireline pair.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A subscriber line interface circuit comprising:

a transconductance amplifier circuit configured as a unity gain buffer and including an operational amplifier having a first, non-inverting input coupled to a reference voltage, and a second, inverting input, and an output stage coupled in a first current flow path between a first current mirror circuit coupled to a first voltage supply and a second current mirror circuit coupled to a second voltage supply, said output stage having an output thereof coupled to an input terminal to which an input signal is applied, and being coupled by way of a feedback path to said second input of said operational amplifier, a first output port coupled to a second current flow path between said first and second current mirror circuits and providing a first output current having a first direction of current flow relative to said first output port, a third current mirror circuit cross-coupled between said first voltage supply and said second current mirror circuit, and a fourth current mirror circuit cross-coupled between said second voltage supply and said first current mirror circuit, a second output port coupled to a third current flow path between said third and fourth current mirror circuits and providing a second output current equal to said first output current and having a second direction of current flow relative to said second output port that is opposite to said first direction of current flow relative to said first output port;

a first output amplifier having a non-inverting input coupled to a reference voltage, an inverting input coupled to said first output port, a first output terminal adapted to be coupled to a first wireline conductor, and a feedback resistor coupled between said inverting input of said first output amplifier and said first output terminal; and a second output amplifier having a non-inverting input coupled to said reference voltage, an inverting input coupled to said second output port, a second output terminal adapted to be coupled to a second wireline conductor, and a feedback resistor coupled between said inverting input of said second output amplifier and said second output terminal.

2. A subscriber line interface circuit according to claim 1, wherein said input terminal is coupled through respective input resistors to receive a plurality of respectively different input channel voltages.

3. A subscriber line interface circuit according to claim 2, wherein said plurality of respectively different input channel voltages include one or more of a received channel signal, a feedback channel voltage, a teletax or pulse metering signal, and a ringing signal voltage.

4. A subscriber line interface circuit according to claim 1, wherein said output stage comprises a differentially coupled transistor circuit pair having a current flow path therethrough coupled to said first and second current mirror circuits, and a common node coupled to said input terminal.

5. A subscriber line interface circuit according to claim 1, wherein first output amplifier includes a sense resistor coupled between an output thereof and said first output terminal, and said second output amplifier includes a sense resistor coupled between an output thereof and said second output terminal.

6. A transconductance amplifier circuit comprising:

at least one input port;

an output port;

an operational amplifier having first and second input nodes, and an output node, said operational amplifier including a gain stage cascaded with an output stage, said gain stage having an inverting input coupled to said first input node, and a non-inverting input coupled to said second input node, and said output stage having an output thereof coupled to said output node, said output of said output stage being coupled by way of a feedback path to said inverting input of said gain stage;

a first current mirror circuit coupled to a first voltage supply, and having a first current mirror input port coupled to said output stage, and a first current mirror output port;

a second current mirror circuit coupled to a second voltage supply, and having a second current mirror input port coupled to said output stage, and a second current mirror output port;

said at least one input port being coupled to said output node; and said output port being coupled to said first and second current mirror output ports.

7. The transconductance amplifier circuit according to claim 6, wherein said output stage comprises a differentially coupled transistor circuit pair having a current flow path therethrough coupled to said first and second current mirror input ports, and a common node coupled to said output node and thereby to said at least one input port.

8. The transconductance amplifier circuit according to claim 6, wherein said at least one input port comprises a plurality of input ports.

9. The transconductance amplifier circuit according to claim 6, wherein said non-inverting input of said gain stage is coupled to a prescribed reference voltage.

10. The transconductance amplifier circuit according to claim 6, wherein said first current mirror circuit has a third current mirror output port, and said second current mirror circuit has a fourth current mirror output port; and further including a third current mirror circuit coupled to said second voltage supply, and having a third current mirror input port coupled to said third current mirror output port of said first current mirror circuit, and a fifth current mirror output port;

a fourth current mirror circuit coupled to said first voltage supply, and having a fourth current mirror input port coupled to said fourth current mirror output port of said second current mirror circuit, and a sixth current mirror output port; and a further output port coupled to said fifth and sixth current mirror output ports.

11. The transconductance amplifier circuit according to claim A, further including a first output amplifier having a non-inverting input coupled to a reference voltage, an inverting input coupled to said output port, a:first output terminal, and a feedback resistor coupled between said inverting input of said first output amplifier and said first output terminal; and a second output amplifier having a non-inverting input coupled to said reference voltage, an inverting input coupled to said further output port, a second output terminal, and a feedback resistor coupled between said inverting input of said second output amplifier and said further output terminal.

12. The transconductance amplifier circuit according to claim 8, wherein said at least one input port comprises a plurality of input ports coupled through respective input resistors to receive a plurality of respectively different input signals.

13. The transconductance amplifier circuit according to claim 12, wherein said plurality of respectively different input signals include one or more of a received channel signal, a feedback channel voltage, a teletax or pulse metering signal, and a ringing signal voltage for a subscriber line circuit.

14. The transconductance amplifier circuit according to claim 11, wherein first output amplifier includes a first sense resistor coupled between an output thereof and said first output terminal, and said second output amplifier includes a second sense resistor coupled between an output thereof and said second output terminal.

* * * * *